(12) United States Patent
Kurita et al.

(10) Patent No.: US 9,273,235 B2
(45) Date of Patent: Mar. 1, 2016

(54) BONDING MATERIAL COMPRISING COATED SILVER NANOPARTICLES AND BONDED OBJECT PRODUCED USING SAME

(75) Inventors: Satoru Kurita, Okayama (JP); Takashi Hinotsu, Okayama (JP); Shinya Sasaki, Okayama (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 62 days.

(21) Appl. No.: 14/124,509

(22) PCT Filed: Jun. 10, 2011

(86) PCT No.: PCT/JP2011/063421
§ 371 (c)(1),
(2), (4) Date: Dec. 6, 2013

(87) PCT Pub. No.: WO2012/169076
PCT Pub. Date: Dec. 13, 2012

(65) Prior Publication Data
US 2014/0113109 A1    Apr. 24, 2014

(51) Int. Cl.
*B32B 5/16* (2006.01)
*B32B 25/02* (2006.01)
(Continued)

(52) U.S. Cl.
CPC ............. *C09J 11/06* (2013.01); *B22F 1/0062* (2013.01); *C22C 5/06* (2013.01); *H01L 24/29* (2013.01); *H01L 24/83* (2013.01); *H05K 1/092* (2013.01); *B22F 1/0018* (2013.01); *H01L 24/27* (2013.01); *H01L 24/32* (2013.01); *H01L 2224/2732* (2013.01); *H01L 2224/29294* (2013.01); *H01L 2224/29339* (2013.01);
(Continued)

(58) Field of Classification Search
USPC .................................. 428/403–407, 328, 409
See application file for complete search history.

(56) References Cited

U.S. PATENT DOCUMENTS

2005/0267243 A1    12/2005  Amasaki et al.
2009/0162557 A1*    6/2009  Lu et al. ...................... 427/383.3
(Continued)

FOREIGN PATENT DOCUMENTS

CN          101710497 A      5/2010
JP          2005-293851      10/2005
(Continued)

OTHER PUBLICATIONS

Machine translation copy of JP 2005-293851 (2005).*
Machine translation copy of JP 2011-080147 (2011).*
English translation of the International Search Report for PCT/JP2011/063421, mailed on Sep. 6, 2011.
(Continued)

*Primary Examiner* — Holly Le
(74) *Attorney, Agent, or Firm* — Greenblum & Bernstein, P.L.C.

(57) ABSTRACT

A bonding material using silver nanoparticles considerably changes in coating-material property in response to a slight change in composition, and the stability thereof has been insufficient for large-amount application. A bonding material which uses silver nanoparticles, meets the requirements for mass printing, attains dimensional stability, and gives a smooth printed surface is provided. The bonding material includes silver nanoparticles which have at least an average primary particle diameter of 1 nm to 200 nm and have been coated with an organic substance having 8 or less carbon atoms, a dispersion medium, and a viscosity modifier composed of an organic substance, and has a viscosity (measured at a shear rate of 15.7 [1/s]) of 100 Pa·s or lower and a thixotropic ratio (measured at a shear rate of 3.1 [1/s]/measured at a shear rate of 15.7 [1/s]) of 4 or lower.

10 Claims, 6 Drawing Sheets

(51) Int. Cl.
*C09J 11/06* (2006.01)
*C22C 5/06* (2006.01)
*H01L 23/00* (2006.01)
*H05K 1/09* (2006.01)
*B22F 1/00* (2006.01)

(52) U.S. Cl.
CPC ............... *H01L 2224/32245* (2013.01); *H01L 2224/83192* (2013.01); *H01L 2224/83203* (2013.01); *H01L 2924/00011* (2013.01); *H01L 2924/00013* (2013.01); *H01L 2924/01006* (2013.01); *H01L 2924/01029* (2013.01); *H01L 2924/10253* (2013.01); *H01L 2924/1301* (2013.01); *H01L 2924/1305* (2013.01); *H01L 2924/1306* (2013.01); *H01L 2924/13033* (2013.01); *H01L 2924/13055* (2013.01); *H01L 2924/13091* (2013.01); *H01L 2924/15747* (2013.01); *H05K 2201/0224* (2013.01); *H05K 2201/0257* (2013.01); *Y10T 428/24413* (2015.01)

(56) References Cited

U.S. PATENT DOCUMENTS

| | | | |
|---|---|---|---|
| 2011/0048923 A1* | 3/2011 | Nelson et al. | 204/157.43 |
| 2011/0236709 A1 | 9/2011 | Jablonski et al. | |
| 2012/0103515 A1* | 5/2012 | Endoh et al. | 156/325 |
| 2013/0081759 A1* | 4/2013 | Endoh et al. | 156/326 |
| 2013/0323529 A1* | 12/2013 | Kurita et al. | 428/613 |

FOREIGN PATENT DOCUMENTS

| | | |
|---|---|---|
| JP | 2005-340095 | 12/2005 |
| JP | 2011-041955 | 3/2011 |
| JP | 2011-046770 | 3/2011 |
| JP | 2011-080147 | 4/2011 |
| WO | 2011/007402 | 1/2011 |

OTHER PUBLICATIONS

English translation of the Written Opinion for PCT/JP2011/063421, mailed on Sep. 6, 2011.
Chinese Office Action issued for application No. 201180071540.3, Jan. 5, 2015.

* cited by examiner (a)

(b)

(c)

(d)

BONDING MATERIAL COMPRISING COATED SILVER NANOPARTICLES AND BONDED OBJECT PRODUCED USING SAME

FIELD

The present invention relates to a bonding material which can be used at low temperatures, and in particular, to a paste which is a bonding material containing metal nanoparticles.

BACKGROUND

A metal having a smaller particle diameter is known to exhibit specific physical characteristics. Particularly, nanoscale particles significantly exhibit such a tendency. Attempts have been made to use, for example, metal nanoparticles as a bonding material between different substances by utilizing a property in which the melting point thereof is particularly lower than that of a bulk body.

The present applicant also has developed a paste for bonding (bonding material) containing silver nanoparticles and disclosed it in Patent Literatures 1 and 2. In addition, attempts have been made to use silver nanoparticles as a metal material for bonding. For example, techniques in Patent Literatures 3 and 4 are exemplified.

CITATION LIST

Patent Literature

Patent Literature 1: WO 2011/007402 pamphlet
Patent Literature 2: Japanese Patent Application Laid-Open No. 2011-080147
Patent Literature 3: Japanese Patent Application Laid-Open No. 2011-041955
Patent Literature 4: Japanese Patent Application Laid-Open No. 2011-046770

SUMMARY

Technical Problem

A bonding material needs to be applied to a bonding surface during bonding using silver nanoparticles. During the bonding using silver nanoparticles, there is an advantage in which the amount of metal component used in the bonding is decreased. Even when a coating film is formed by a printing method, it is desirable that a bonding material can be applied with good dimensional stability so that the coating film is as thin as possible and has a desired shape.

However, the present inventors have investigated and confirmed a phenomenon in which the viscosity of a bonding material formed by addition of nanoparticles is considerably changed even by a slight change in composition, as shown in, for example, Patent Literature 2. When a paste which does not have appropriate viscosity and thixotropy is used in screen printing among printing methods, a texture of a screen gauze (hereinafter sometimes referred to as "texture of the gauze") may be generated on the printed surface, or sagging may occur. Therefore, the present inventors have found that these may cause failure of bonding. In bonding under a condition in which a texture of a screen gauze is generated, a void is likely to be generated on a bonding interface. As a result, the stability of bonding strength tends to be adversely affected.

In order to overcome such a phenomenon, improvement in the viscosity and thixotropy of the paste is required. The viscosity and thixotropy of a paste is generally adjusted by addition of a binder or a leveling agent. However, since the binder is commonly a macro molecule, a heat treatment at high temperatures is required. In addition, even when the binder is a low molecule, the binder is interposed between the metals to prevent melting of the metals, or to reduce the weather resistance. Therefore, the binder is not preferable.

The leveling agent is added in order to uniformize the surface tension and overcome defects before formation of a coating film by allowing the leveling agent to be spread in a thin film form on a coating film surface. Thus, the leveling agent may remain on the bonding interface. Since the bonding strength and the weather resistant on the bonding interface may be reduced, the leveling agent is not preferable. In particular, there is a concern in which such a phenomenon significantly has an adverse effect in a field designed so as to use nanoparticles.

It is expected that a bonding material which contains silver nanoparticles meets the requirements for mass printing, attains dimensional stability, and gives a smooth printed surface. Therefore, a problem to be solved by the present invention is to provide a bonding material which can be metallized at low temperatures and secure surface smoothness on a coated surface during printing and drying, and a bonded object in which the stability of bonding strength is secured by using the bonding material.

Solution to Problem

The present inventors have extensively investigated the problem and found that the following configuration of a bonding material can solve the problem. Thus, the present invention has been completed.

In order to solve the above-described problem, a bonding material may include silver nanoparticles which have at least an average primary particle diameter of 1 nm to 200 nm and have been coated with an organic substance having 8 or less carbon atoms, a dispersion medium, and a viscosity modifier composed of an organic substance, and may have a viscosity (measured at a shear rate of 15.7 [1/s]) of 100 Pa·s or lower and a thixotropic ratio (measured at a shear rate of 3.1 [1/s]/ measured at a shear rate of 15.7 [1/s]) of 4 or lower.

It is preferable that the bonding material further contain silver particles having an average particle diameter of 0.5 to 10.0 μm as a silver component.

In particular, a substance having an ether linkage in its structure as the viscosity modifier is suitable for solving the above-described problem. For the ether linkage, the viscosity modifier may contain two or three ether linkages in the structure. In addition, the structure of the viscosity modifier preferably has a carboxyl group. In particular, when the viscosity modifier is 2-methoxyethoxyacetic acid or 2-butoxyethoxyacetic acid, a marked effect can be confirmed.

It is more preferable that the above-described bonding material have a property in which the weight reduction ratio between 250° C. and 350° C. during an increase in temperature from 40° C. at 10° C./min is 0.1% or less in TG measurement under a nitrogen atmosphere.

As a coating film formed from the bonding material by a screen printing method, a coating film having a surface of which the roughness value (Ra value) measured with a laser diffraction type surface roughness tester immediately after coating is 10 μm or less can be obtained. When objects to be bonded are bonded using the bonding material, a bonded object formed with a bonding layer mainly containing silver can be obtained.

Advantageous Effects of Invention

By use of the bonding material according to the present invention, a smooth coating film without generation of a texture of a screen gauze during coating can be formed. In addition, when an object to be bonded is disposed on the smooth coating film and is heated, for example, even at a low temperature of 200 to 300° C. to form a bonded object, the resulting bonded object can have high reliability.

DESCRIPTION OF EMBODIMENTS

Figure 1:
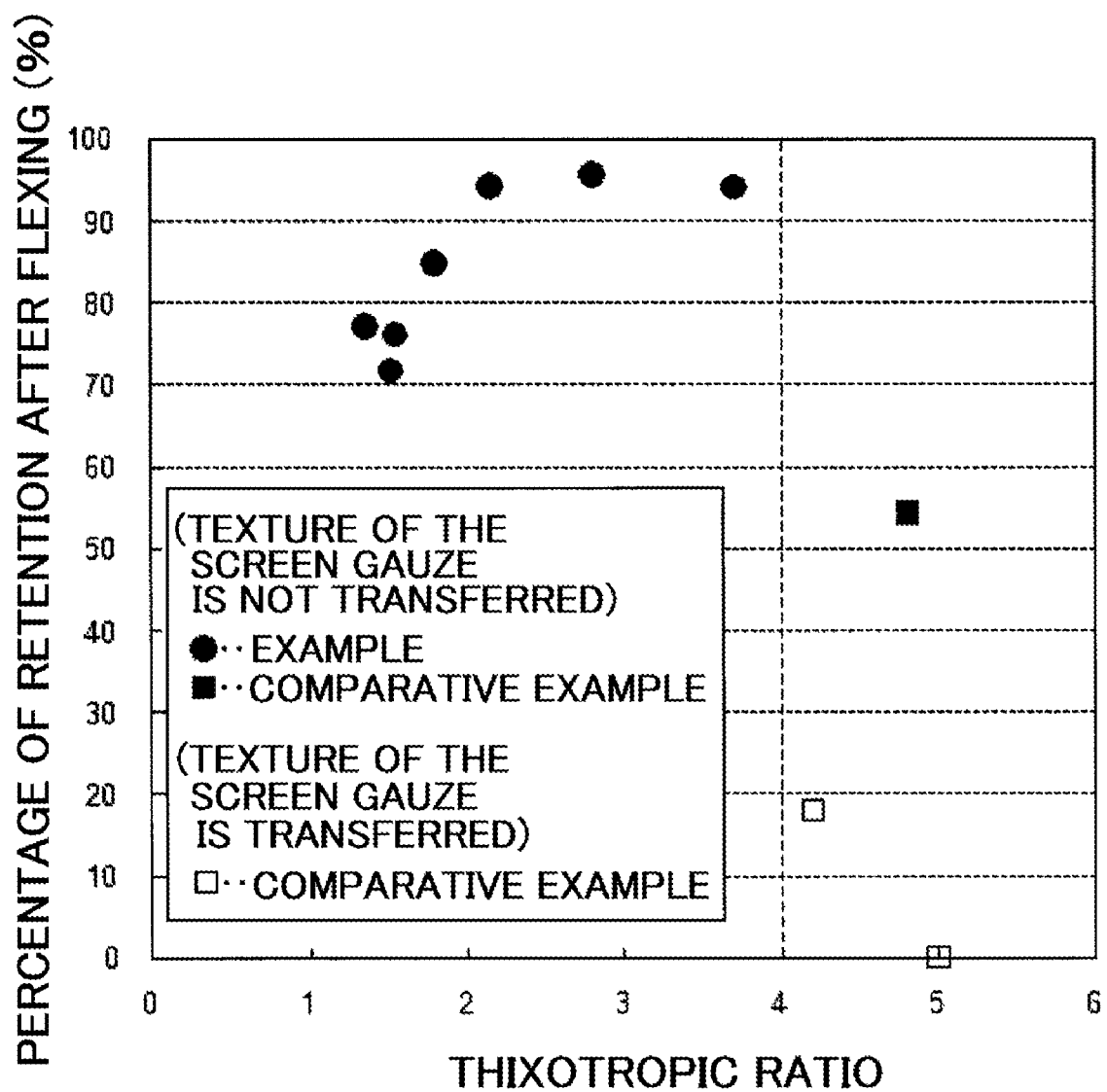
FIG. 1 is a graph showing a relationship of a thixotropic ratio and a percentage of chip retention (bonding strength) during bonding of an Si chip. A black symbol represents an example in which a texture of a screen gauze is not transferred during printing, and a white symbol represents an example in which a texture of a screen gauze is transferred during printing.

Silver nanoparticles constituting the bonding material according to the present invention will be first described, and other substances constituting the bonding material, a method for producing the bonding material, a method for evaluating the bonding material, and a method for evaluating a bonded object will be then described.

<Silver Nanoparticles>

The silver nanoparticles constituting the bonding material according to the present invention have an average primary particle diameter of 200 nm or smaller, preferably 1 to 150 nm, and more preferably 10 to 100 nm. The use of the silver nanoparticles having such a particle diameter allows a bonded object having a high bonding power to be formed.

The silver nanoparticles constituting the bonding material according to the present invention have surfaces coated with an organic substance as a protective agent. The organic substance is preferably a fatty acid having 8 or less carbon atoms in total. Specific examples thereof may include octanoic acid (caprylic acid), heptanoic acid (enanthic acid), hexanoic acid (caproic acid), pentanoic acid (valeric acid), butanoic acid (butyric acid), and propanoic acid (propionic acid), which are each a saturated fatty acid. Further, examples of dicarboxylic acid may include oxalic acid, malonic acid, methylmalonic acid, ethylmalonic acid, succinic acid, methylsuccinic acid, ethylsuccinic acid, phenylsuccinic acid, glutaric acid, adipic acid, pimelic acid, and suberic acid. Examples of unsaturated fatty acid may include sorbic acid and maleic acid.

Among these, from the viewpoints of productivity and workability, hexanoic acid, heptanoic acid, adipic acid, sorbic acid, and malonic acid are preferable. When the surfaces of silver nanoparticles are coated with the fatty acid, silver nanoparticles in a moderately-aggregated powder form can be obtained.

The silver nanoparticles having surfaces coated with the fatty acid are converted into an aggregate with the form of primary particles being maintained as the silver nanoparticles, and therefore become a form which can be easily collected. The particle diameter of the aggregate is at least 2.5 µm or larger. This can be confirmed from the aggregate which can be collected through a No. 5C paper filter (JIS P-3801). When the aggregate (secondary aggregate) is filtrated off through the paper filter, a filtrate is clear. This is because the aggregate has a particle diameter which is equal to or larger than the opening of the paper filter. When the collected material is subjected to a drying operation at low temperatures (lower than 100° C.), dried powder composed of the aggregate of silver nanoparticles can be obtained.

When the silver nanoparticles are prepared in a powder form, the workability during blending in production of the bonding material according to the present invention is largely improved. Further, silver nanoparticles coated with a plurality of organic substances may be used, or silver nanoparticles having different average primary particle diameters may be used in combination. In the production of the bonding material, the amount of the nanoparticles to be added is 5 to 98% by mass, and preferably 10 to 95% by mass, relative to the total amount of paste.

The silver nanoparticles having such a particle diameter can be produced, for example, by a method described in Japanese Patent No. 4344001. Specific examples will be described in Examples described below.

<Form of Micron Particles Used in Combination>

On the other hand, when micron-scale silver particles (hereafter referred to as "submicron silver particles") are used in combination, it is preferable that silver particles having an average particle diameter of 0.5 µm to 10 µm be used. The average particle diameter herein is calculated by a laser diffraction method in accordance with the following procedure. First, 0.3 g of sample of silver particles is added to 50 mL of isopropyl alcohol and dispersed for 5 minutes using an ultrasonic cleaner at a power of 50 W. Then, the $D_{50}$ value (cumulative 50% by mass particle diameter) is measured by the laser diffraction method using a microtrac particle size distribution analyzer (9320-X100 manufactured by Honeywell-NIKKISO Co., Ltd.) and is used as the average primary particle diameter of submicron silver particles.

The average primary particle diameter of submicron silver particles falls within a range of 0.5 to 10.0 µm, preferably 0.5 to 5.0 µm, and more preferably 0.5 to 3.0 µm. When particles having an average primary particle diameter falling within such a range are used in combination, a bonded object having a high bonding power can be provided. On the other hand, when submicron silver particles having such a particle size distribution are used, silver nanoparticles having an average primary particle diameter of 1 to 200 nm, as described above, are likely to be mixed in interstice parts between the submicron silver particles. As a result, the silver nanoparticles are sintered, and the bonding strength can be enhanced. The surfaces of the submicron silver particles may be coated with an organic substance to improve the dispersibility. However, the effects of the present invention are not reduced without coating, and therefore the kind of the organic substance is not particularly limited. Since the organic substance is unlikely to be decomposed by using a macro molecule formed by polymerization, it is not preferable.

<Mixing Ratio of Silver Nanoparticles and Submicron Silver Particles>

The mixing ratio by mass of metal component of silver nanoparticles coated with an organic compound to submicron silver particles (silver nanoparticles/submicron silver particles) is preferably 0.1 to 10.0, more preferably 0.15 to 9.0, and still more preferably 0.2 to 5.0. When the ratio by mass of metal component of silver nanoparticles coated with an organic compound to submicron silver particles is such a ratio, more silver nanoparticles may be present in the interstice part and sintering is promoted. Therefore, it is preferable. The total amount of silver of the silver nanoparticles and submicron silver particles to be added is 5 to 98% by mass, and preferably 10 to 95% by mass, relative to the total amount of paste.

<Measurement and Evaluation of Silver Nanoparticles>

The particle diameter of silver nanoparticles is calculated from a transmission electron microscope (TEM) or scanning electron microscope (SEM) photograph. Specifically, the TEM photograph is confirmed. When a primary particle diameter of 50 nm or smaller is recognized, the particle diameter is calculated from the TEM photograph. When a primary particle diameter larger than 50 nm is recognized, the particle diameter is calculated from the SEM photograph.

In calculation from TEM, 2 parts by mass of silver nanoparticles are added to a mixed solution of 96 parts by mass of cyclohexane and 2 parts by mass of oleic acid, and dispersed by ultrasonic wave to obtain a dispersion solution. The resulting dispersion solution is dropped onto a Cu microgrid with a support film and then dried to produce a TEM specimen. The particles on the microgrid which is the produced TEM specimen are observed in a bright field with a transmission electron microscope (JEM-100CXMark-II manufactured by JEOL Ltd.) at an acceleration voltage of 100 kV, and are taken at a magnification of 300,000.

In calculation from SEM, a dried powder is fixed on a carbon tape, and the particle diameter is confirmed with a scanning electron microscope (S-4700 manufactured by Hitachi High-Technologies Corporation) at a magnification of 10,000 to 60,000.

The particle diameter may be directly measured by a vernier caliper or the like from the TEM or SEM photograph of the silver nanoparticles, or the particle diameter may be calculated by an image analysis software. In either case, the average primary particle diameter of the silver nanoparticles is determined as the number average of the measured diameters of at least 200 independent particles in the TEM or SEM photograph.

<Substance Constituting Bonding Material and Production Method>

To the silver nanoparticles obtained by the above-described method, a solvent and a viscosity modifier composed of an organic substance having two or more ether linkages are added to produce a bonding material.

The used solvent is preferably a polar solvent, and examples thereof may include water, alcohol, polyol, glycol ether, 1-methylpyrrolidinone, pyridine, terpineol, butyl carbitol, butyl carbitol acetate, texanol, phenoxypropanol, diethyleneglycol monobutyl ether, diethylene glycol monobutyl ether acetate, γ-butyrolactone, ethylene glycol monomethyl ether acetate, ethylene glycol monoethyl ether acetate, methoxybutyl acetate, methoxypropyl acetate, diethylene glycol monoethyl ether acetate, ethyl lactate, 1-octanol, and octanediol.

<Viscosity Modifier Composed of Organic Substance>

In order to reduce the viscosity and thixotropy of a bonding material, it is characterized by the addition of a substance having two or more ether linkages as a viscosity modifier composed of an organic substance. Specific examples thereof may include polyoxyethylene lauryl ether acetic acid, 2-butoxyethoxyacetic acid, and 2-methoxyethoxyacetic acid. By addition of such a substance, the viscosity and thixotropy of a bonding material are reduced, and a bonding material suitable for printing as described below is produced. The amount of added substance having two or more ether linkages is more than 0 to 2.0%, preferably 0.2 to 2.0%, and more preferably 0.5 to 2.0%, relative to the total amount of the bonding material.

<Flux>

The bonding material of the present invention may contain a flux component composed of an organic substance (sintering accelerating component). The flux component herein specifically represents an organic substance having two or more carboxyl groups. A dicarboxylic acid further having an ether linkage is more preferable. Preferred examples of the organic substance having two or more carboxyl groups as the flux component may include a glycolic acid which is an organic substance having a dicarboxylic acid structure and an oxydiacetic acid (diglycolic acid) which is a dicarboxylic acid further having an ether linkage. The amount of flux component added is 0.01 to 1.0%, preferably 0.02 to 0.7%, and more preferably 0.05 to 0.5%, relative to the total amount of the bonding material.

Since the silver nanoparticles according to the present invention are very small, the particles tend to be aggregated. In order to disperse the particles, a dispersant may be added. Any commercial general-purpose dispersant can be used so long as it has an affinity for the silver nanoparticle surfaces and an affinity for the dispersion medium. Not only a single kind of dispersant but also a plurality of dispersants may be used in combination. The dispersant has a high decomposition temperature, and a dispersant having a decomposition temperature of 250° C. or lower is preferable. Specific examples thereof may include lauric acid, oleic acid, and linoleic acid.

In preparation of the bonding material, an appropriate mechanical dispersion treatment may be used. Any known method can be used for the mechanical dispersion treatment as long as the particles are not significantly reformed. Specific examples of the mechanical dispersion treatment may include ultrasonic dispersion, a dispersion mill, a triple roll mill, a ball mill, a bead mill, a biaxial kneader, and a planetary mixer. These may be used alone or in combination of two or more.

<Method for Evaluating Bonding Material>

Next, the method for evaluating the bonding material of the present invention and the method for evaluating a bonded object will be described. In evaluation of the bonding material, the viscosity, thixotropic ratio, and thermal decomposition are evaluated. In evaluation of a bonded object, the bonding material of the present invention is printed on a metal substrate by screen printing, and the bonding strength of the metal substrate and a silicon chip after pressurizing and firing and the surface roughness are evaluated.

(Viscosity and Thixotropic Ratio)

The viscosity and thixotropic ratio of the produced paste are evaluated with a rheometer (RheoStress 600 manufactured by HAAKE) and a cone having a φ of 35 mm and an angle of 2°. While the shear rate is changed into 1.6, 3.1, 6.3, 15.7, 31.3, 62.7, and 156.7 [1/s] under a condition of a gap of 0.105 mm and a temperature of 25° C. during measurement, the viscosities after 20 seconds are measured at each shear rate. Among them, the viscosity is a value when the shear rate is 15.7 [1/s]. The thixotropic ratio is a value obtained by dividing the viscosity at a shear rate of 3.1 by the viscosity at a shear rate of 15.7.

It is important that the thixotropic ratio which is a value obtained by dividing the viscosity at a shear rate of 3.1 [1/s] by the viscosity at a shear rate of 15.7 [1/s] is 4.0 or lower. The bonding material according to the present invention is in a form in which silver fine particles (hereinafter silver nanoparticles and submicron silver particles will be collectively referred to as "silver fine particles") are generally dispersed in a solvent. The silver fine particles may be partially an aggregate and independent as fine particles similar to primary particles.

However, in order to use one kind of coating material in which a solvent and silver fine particles are completely mixed as a coating material used in coating of an object to be bonded, the solvent and the silver fine particles must not be separated. This is so-called "paste state," and an evaluation method is not particularly restricted.

In the present invention, the paste state is evaluated by the ratio (thixotropic ratio) of the viscosity at a shear rate of 3.1 [1/s] to the viscosity at a shear rate of 15.7 [1/s]. That is, the value of viscosity of the coating material in which the solvent and the silver fine particles are completely mixed is changed depending on a difference in shear rate. However, when the shear rate falls within such a range, a viscous substance does not considerably change in property.

On the other hand, when a solvent and silver fine particles are separated, the viscosity of only the solvent mainly appears at a higher shear rate. Therefore, the viscosity is lower and the thixotropic ratio is larger, as compared with the viscosity at a low shear rate. In consideration of application property of the bonding material according to the present invention, the thixotropic ratio on this boundary is 4.0 on the basis of the investigation of the present inventors.

The evaluation by the thixotropic ratio is suitable. This is because the application property of the bonding material which is not judged only by the viscosity at a certain shear rate can be evaluated. Therefore, even when the apparent viscosity is low and the silver fine particles and the solvent are not completely mixed, as shown in Comparative Examples below, the thixotropic ratio becomes higher, and the application property of the bonding material becomes lower. In particular, the shape retention of the coating material is high and the shape of texture of a screen gauze after passing through a screen remains. As a result, the bonding strength becomes low.

On the other hand, when the apparent viscosity is high but the thixotropic ratio is low, the application property of the bonding material is favorable. As a result, the bonding strength becomes high.

Thus, the thixotropic ratio is an index exhibiting integrity of silver fine particles and a solvent as a coating material, and means that the dispersibility of silver fine particles in the solvent is evaluated.

When the thixotropic ratio is low (4.0 or lower) but the viscosity value is too high, coating is impossible. Therefore, the viscosity of the bonding material of the present invention at a shear rate of 15.7 [1/s] is preferably 100 Pa·s or less. Similarly, when the thixotropic ratio is low and the viscosity value is too low, the bonding material does not remain at the predetermined position of object to be bonded, and flows. Therefore, it is not preferable. The viscosity of the bonding material of the present invention at a shear rate of 15.7 [1/s] is preferably 0.5 Pa·s or more.

As described above, in the bonding material of the present invention, a viscosity at a shear rate of 15.7 [1/s] of 100 Pa·s or less and a thixotropic ratio of 4.0 or lower are preferable, a viscosity of 80 Pa·s or less and a thixotropic ratio of 3.5 or lower are more preferable, and a viscosity of 50 Pa·s or less and a thixotropic ratio of 3.0 or lower are particularly preferable. When the viscosity is too high and the thixotropic ratio is low, the bonding material is not suitable for continuous printing due to effects of friction and the like. Even when the viscosity appears within a range of viscosity suitable for printing, a bonding material having a high thixotropic ratio has high shape retention of a paste, and the texture of a screen gauze remains. Therefore, a paste suitable for screen printing has a thixotropic ratio of 4.0 or lower, and preferably a viscosity which falls within the above-described range. When the viscosity is too low, the moldability after printing is not kept. Therefore, it is not preferable. A preferred range of viscosity may be 0.5 Pa·s or more, and preferably 1.0 Pa·s or more.

(Thermal Decomposition)

The thermal decomposition of the produced paste is confirmed by an increase in temperature from 40° C. to 700° C. at a temperature increasing rate of 10° C./min in a nitrogen atmosphere with a thermogravimetric differential thermal analyzer (TG/DTA6300 manufactured by SII). At this time, a lower decomposition temperature exhibits a tendency of facilitating sintering during heating, and this is suitable for formation of a bonded object at low temperatures. When decomposition occurs at very low temperatures, a bonded object may be metallized upon storage, and therefore this is not preferable.

The weight reduction ratio during heating is important as a control factor. It is preferable that the weight reduction ratio between 250° C. and 350° C. during an increase in temperature from 40° C. at 10° C./min be 0.1% or less. When a paste falling within the range reaches 250° C., most of a volatile component is volatilized and removed, and a bonding layer having a high purity can be formed. This contributes to enhancement in bonding strength. Therefore, the weight reduction ratio at this time is preferably lower.

(Evaluation of Component)

An organic component in the bonding material can be confirmed by GC-MS. Herein, particles are heated to 350° C. under a helium gas atmosphere using GC-MS device 7890A GC System and 5975C inert XL EI/CI MSD manufactured by Agilent technologies and a gas component collected is evaluated.

<Formation of Bonded Object>

In order to evaluate a bonded object, the produced bonding material is printed with a screen printer (printer manufactured by Micro-tec Co., Ltd.: MT-320T and Micro-Squeegee: B70) on a surface of a metal substrate which is a first member to be bonded so that a bonded part is formed. The printing is performed using a pattern of square of 13 mm (325 mesh manufactured by SONOCOM Co., Ltd., wire diameter: 28 μm, thickness of emulsion: 20 μm) as a screen mask under a condition of a printing speed of 120 mm/s, a printing pressure of 100 kPa, and a clearance of 1.0 mm. After coating, the bonding material is subjected to a heat treatment at low temperature (hereinafter referred to as preliminary firing), bonded to an object to be bonded which is a second member to be bonded, and subjected to a heat treatment at high temperatures (hereinafter referred to as main firing) to metallize the bonding material. In bonding without pressurization, preliminary firing is not always necessary. Therefore, a bonded object can be produced only by a main firing step after printing without a preliminary drying step and a pressurizing step described later.

When a solvent is contained in the bonding material applied to the substrate surface, a passage of volatile component of the solvent is formed during main firing, and as a result, a void may be generated in a formed bonding layer. It is preferable that the bonding material applied to the substrate surface be subjected to heat treatment as preliminary firing to remove the solvent under a condition of a temperature lower than the decomposition temperature of the silver nanoparticles used in the bonding material and the boiling point of the dispersion medium to remove the solvent in the bonding material. By performing the preliminary firing, the generation of a void in the bonding layer during formation of the bonded object can be suppressed. By extension, the bonding strength of the bonding layer can be enhanced. Therefore, it is preferable.

The preliminary firing temperature is generally within a range of 50 to 150° C., and it is preferable that the temperature be set to a temperature lower than the preset temperature of the main firing by 150 to 300° C. The time for preliminary firing depends on the area to be bonded. It is sufficient that the firing time is about 10 minutes. In some cases, heating for about 30 seconds is sufficient.

After the preliminary firing, an Si chip is disposed as the second object to be bonded on the upper portion of the coating layer of the bonding material. The objects to be bonded are heated under pressurizing to form a bonded object. The pressurization pressure at this time can be appropriately set by a material to be bonded. In consideration of effects of objects to be bonded, it is preferable that the pressurization pressure be 20 MPa or lower, and preferably 15 MPa or lower.

It is preferable that the temperature during formation of bonding layer in the main firing be as low as 150° C. to 400° C., preferably 180 to 350° C., and more preferably 200 to 350° C. The main firing temperature can also be appropriately set depending on the kinds of bonded object and substrate. Further, the main firing temperature is maintained for 0.5 minutes to 60 minutes, preferably 1 minute to 30 minutes, more preferably 1 minute to 10 minutes to promote metallization of silver nanoparticles in the bonding layer, and as a result, a more rigid bonding layer can be obtained.

(Film Thickness and Surface Roughness)

It is difficult to accurately measure values of the film thickness and surface roughness after coating and after preliminary firing with a contact type surface roughness tester (SURFCOM 1500DX-12 manufactured by TOKYO SEIMITSU CO., LTD.) since the tester comes into contact with the film. Therefore, the film thickness and surface roughness are measured with a laser microscope (VK-9700 manufactured by KEYENCE CORPORATION). When the bonded object which is the second member to be bonded such as an Si chip is bonded, the surface roughness is not confirmed. A bonded object is assumed, a bonding procedure is performed using glass as the second member to be bonded, and a surface roughness after pressurizing and firing is measured with the contact type surface roughness tester. Thus, a profile of a fired film is obtained. Since the glass which serves as the second member to be bonded cannot be bonded through the bonding material, a state of the fired film can be seen subsequently in accordance with a procedure including pressurizing and firing.

(Bonding Strength)

The bonding power of the resultant bonded object is measured. Specifically, the both ends of a copper substrate are pinched by an offset wrench, and the substrate is bent at about 90°. After that, the substrate returns to a state before bending, and the area of Si chip which is not peeled on the substrate is measured. Specifically, the area of Si chip is subjected to binarization using an image analysis software to calculate a residual area ratio of Si chip. It is judged that as the residual area ratio is higher, the bonding power is higher.

Figure 6:
FIG. 6 is a view illustrating a measurement example of flex durability.
Figure 6:
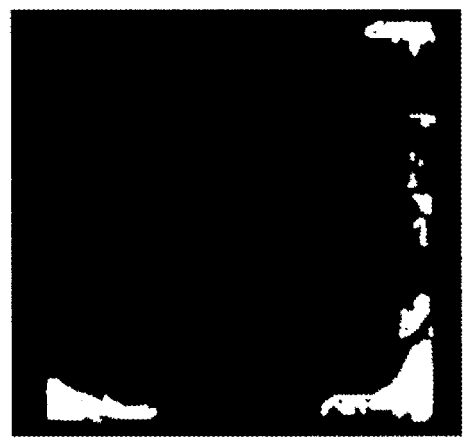
Figure 6:
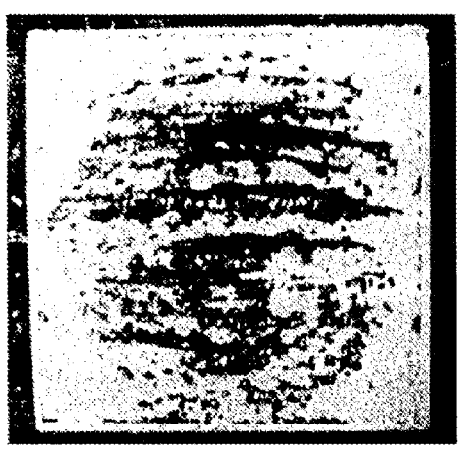
Figure 6:

FIG. 6 shows a measurement example of bonding strength. FIGS. 6(a) and 6(c) show photographs of residue of Si chip. In FIG. 6(a), most parts remains, and in FIG. 6(c), an Si chip remains in a pattern which is a transverse line like fingerprint in a central region. FIGS. 6(b) and 6(d) are results obtained by binarization of FIGS. 6(a) and 6(c), respectively, using the image analysis software. A black part is a part in which Si remains, and a white part is a part in which Si is not judged to remain. A residual area ratio represents a ratio (referred to as a retention ratio, unit: %) of an area of the part judged to be the black part relative to the entire area of the substrate. Herein, the retention ratio is an index of flex durability (bonding strength).

EXAMPLES

Hereinafter, the present invention will be more specifically described with reference to Examples.

Example 1

Synthesis of Silver Nanoparticles

In a 500-mL beaker, 13.4 g of silver nitrate (available from TOYO KAGAKU, INC.) was dissolved in 72.1 g of pure water to prepare a raw material solution.

Separately, 1.4 L of pure water was placed in a 5-L beaker, and was bubbled with nitrogen for 30 minutes to remove dissolved oxygen, and was then heated to 40° C. Subsequently, 17.9 g of sorbic acid (available from Wako Pure Chemical Industries, Ltd.) was added as a protective agent to the pure water. Next, 2.8 g of 28% ammonia water (available from Wako Pure Chemical Industries, Ltd.) was added as a stabilizing agent.

In the following Examples and Comparative Examples, a point of adding ammonia water was a point of starting preparation of silver nanoparticles.

The added solution of ammonia was continuously stirred, and 5 minutes after starting the preparation of silver nanoparticles, 6.0 g of hydrous hydrazine (purity: 80%, available from Otsuka Chemical Co., Ltd.) was added as a reducing agent to prepare a reducing solution. Ten minutes after starting the preparation of silver nanoparticles, the raw material solution adjusted to a liquid temperature of 40° C. was added at a stretch to the reducing solution to cause a reaction, and stirring was ended.

After the end of stirring, the reactant was aged for 30 minutes to form an aggregate of silver nanoparticles coated with sorbic acid. After that, a solution containing the aggregate of silver nanoparticles formed was filtrated through a No. 5C paper filter and the collected material was washed with pure water to obtain an aggregate of silver nanoparticles. The aggregate of silver nanoparticles was dried in a vacuum dryer at 80° C. for 12 hours, to obtain a dried powder of aggregate of silver nanoparticles.

<Preparation of Bonding Material>

88.0 g of the resulting dried powder of aggregate of silver nanoparticles coated with sorbic acid (average primary particle diameter: 100 nm) as a silver nanoparticle powder, 1.000 g of 2-methoxyethoxyacetic acid (MEA) (available from Sigma-Aldrich Co. LLC.) for decreasing the viscosity and thixotropic ratio, 0.098 g of oxydiacetic acid (DGA) (available from Wako Pure Chemical Industries, Ltd., diglycolic acid) as a flux, and 10.902 g of octanediol (ODO) (available from Kyowa Hakko Chemical Co., Ltd., 2-ethyl-1,3-hexanediol) as a dispersion medium were mixed to obtain a mixture.

The mixture was kneaded with a kneading-degassing device (Model V-mini300 manufactured by EME Corporation) for 30 seconds (kneading condition/Revolution: 1,400 rpm, Rotation: 700 rpm), and then passed through a triple roll (22851Norderstedt manufactured by EXAKT Apparatebaus) five times to obtain a bonding material (paste) according to Example 1. The composition of bonding material according to Example 1 is shown in Table 1. In Table 1, each component is represented as percent by mass. Since the whole prepared amounts are all 100 g in the following Examples and Comparative Examples, the prepared amount in each example can be read as percent by mass in Table 1 as it is.

The viscosity of the bonding material was measured by the above-described method using a rheometer. As a result, the thixotropic ratio was 3.7. The thermal decomposition of the prepared paste was confirmed by an increase in temperature from 40° C. to 700° C. at a temperature increasing velocity of 10° C./min in a nitrogen atmosphere using a thermogravimetric differential thermal analyzer (TG/DTA6300 manufactured by SII). The weight difference (thermal weight reduction ratio) between 350° C. and 250° C. was determined from the results, and found to be 0.10%. The results are shown in Table 2.

<Formation of Bonded Member>

Figure 2:
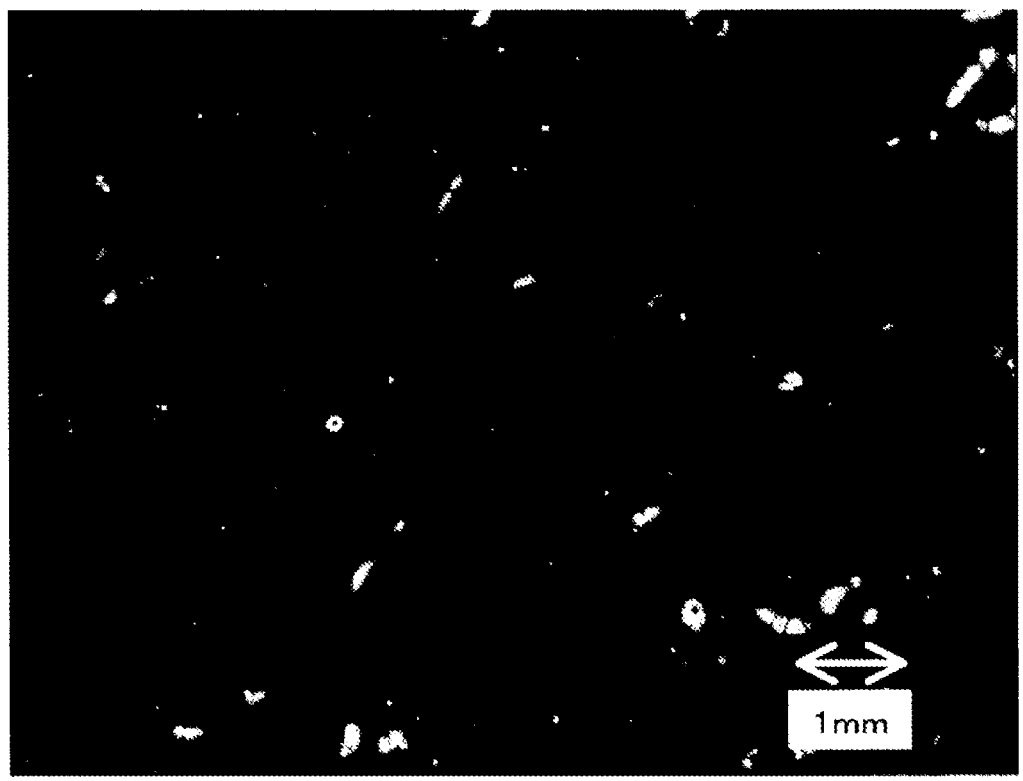
FIG. 2 is a photograph of a coating film in Example 1.

A screen printing using the resulting paste was applied to a silver-plated copper substrate, and the film thickness and surface roughness were measured with a laser microscope. The film thickness was 33.8 μm and the surface roughness (Ra) was 9.0 μm. The results are shown in Table 3. FIG. 2 shows an image of the coating film.

FIG. 2 is a photograph of the bonding material after coating with a metallurgical microscope at a magnification of 100. There were slight irregularity and dropout (part which is seen as white in the photograph), but a texture of a screen gauze was completely lost, and the surface was substantially smooth.

A copper substrate coated with the resulting bonding material was subjected to preliminary firing at 110° C. for 30 minutes in an air atmosphere, to obtain a preliminary fired film. The film thickness and surface roughness of the preliminary fired film were measured with a laser microscope. The film thickness was 18.9 μm and the surface roughness (Ra) was 5.7 μm. The results are shown in Table 3.

After the preliminary firing, the copper substrate coated with the bonding material was cooled to 25° C., and a chip (12.5 mm square silver-plated Si chip with a thickness of 0.3 mm) was mounted on the coated surface.

Figure 3:
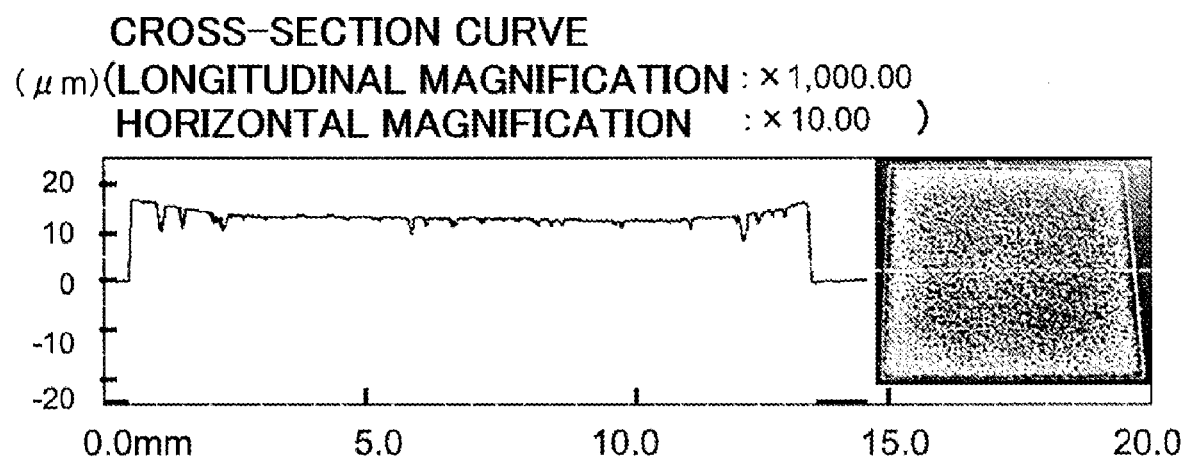
FIG. 3 is a profile view of a pressurized and fired film which is measured with a stylus type surface roughness tester in Example 1.

The copper substrate on which the chip was mounted was set in a compact thermal press machine (manufactured by AS ONE Corporation), pressurized at 10 MPa, heated to 260° C. in about 10 seconds, and after reaching 260° C., held for 2.5 minutes as main firing, to obtain a bonded object according to Example 1. For measurement of surface roughness of the film after pressurizing and firing, a copper substrate on which a 15 mm square glass was mounted as a chip was pressurized and fired in the same manner as described above, to obtain a fired film. The resulting fired film was measured with a surface roughness tester, to obtain a profile of the fired film in FIG. 3. A photograph of film surface is shown next to the profile. A white dotted line is a measurement line. From visual observation, the film had a uniform planar surface. In actual measurement with a surface roughness tester, a result exhibiting a smooth surface was obtained. The Si chip retention ratio during flexion test (hereinafter referred to as "flex durability") was 94.2%. The results are shown in Table 3.

Example 2

The same operation as in Example 1 was performed except that 87.0 g of dried powder of aggregate of silver nanoparticles coated with sorbic acid (average primary particle diameter: 100 nm) as a silver nanoparticle powder, 1.000 g of 2-methoxyethoxyacetic acid (MEA) for decreasing the viscosity and thixotropic ratio, 0.097 g of oxydiacetic acid (DGA) as a flux, and 11.903 g of octanediol (ODO) as a dispersion medium were used, whereby a bonding material according to Example 2 was prepared. The same evaluation as in Example 1 was performed. The evaluation results are shown in Tables 1 to 3.

During the preparation of the bonding material, the thixotropic ratio was 2.8, and the thermal weight reduction ratio was 0.06%. The surface roughness (Ra) after coating was 5.0 μm and the surface roughness (Ra) of preliminary fired film was 3.9 μm. The flex durability was 95.6%.

Example 3

The same operation as in Example 1 was performed except that 85.0 g of dried powder of aggregate of silver nanoparticles coated with sorbic acid (average primary particle diameter: 100 nm) as a silver nanoparticle powder, 1.000 g of 2-methoxyethoxyacetic acid (MEA) for decreasing the viscosity and thixotropic ratio, 0.094 g of oxydiacetic acid (DGA) as a flux, and 13.906 g of octanediol (ODO) as a dispersion medium were used, whereby a bonding material according to Example 3 was prepared. The same evaluation as in Example 1 was performed. The evaluation results are shown in Tables 1 to 3.

During the preparation of the bonding material, the thixotropic ratio was 2.1, and the thermal weight reduction ratio was 0.09%. The surface roughness (Ra) after coating was 3.0 μm and the surface roughness (Ra) of preliminary fired film was 3.0 μm. The flex durability was 94.3%.

Example 4

The same operation was performed except that 45.0 g (the ratio in the whole amount of silver was 50.00% by mass) of dried powder of aggregate of silver nanoparticles coated with sorbic acid (average primary particle diameter: 100 nm) as a silver nanoparticle powder, 45.0 g (the ratio in the whole amount of silver was 50.00% by mass) of silver spherical particle powder (2-1C spherical silver powder available from DOWA ELECTRONICS MATERIALS CO., LTD., average primary particle diameter ($D_{50}$): 1.0 μm), 1.0 g of 2-methoxyethoxyacetic acid (MEA) for decreasing the viscosity and thixotropic ratio, 0.050 g of oxydiacetic acid (DGA) as a flux, and 8.950 g of octanediol (ODO) as a dispersion medium were used, whereby a bonding material according to Example 4 was prepared. The same evaluation as in Example 1 was performed. The evaluation results are shown in Tables 1 to 3.

During the preparation of the bonding material, the thixotropic ratio was 1.8, and the thermal weight reduction ratio was 0.07%. The surface roughness (Ra) after coating was 2.1 μm and the surface roughness (Ra) of preliminary fired film was 1.9 μm. The flex durability was 85.0%.

Example 5

The same operation as in Example 4 was performed except that oxydiacetic acid (DGA) was not used (not added) as a flux and 9.000 g of octanediol (ODO) was used as a dispersion medium, whereby a bonding material according to Example 5 was prepared. The same evaluation as in Example 1 was performed. Therefore, 1.0 g of 2-methoxyethoxyacetic acid (MEA) was contained for decreasing the viscosity and thixotropic ratio. The evaluation results are shown in Tables 1 to 3.

During the preparation of the bonding material, the thixotropic ratio was 1.4, and the thermal weight reduction ratio was 0.08%. The surface roughness (Ra) after coating was 2.2

μm and the surface roughness (Ra) of preliminary fired film was 2.0 μm. The flex durability was 77.1%.

Example 6

The same operation as in Example 4 was performed except that the amount of oxydiacetic acid as a flux was changed into 0.025 g, 2-methoxyethoxyacetic acid (MEA) added for decreasing the viscosity and thixotropic ratio was changed into 2-butoxyethoxyacetic acid (BEA) (available from Sigma-Aldrich Co. LLC.) (1.000 g), and the amount of octanediol (ODO) as a dispersion medium was changed into 8.975 g, whereby a bonding material according to Example 6 was prepared. The same evaluation as in Example 1 was performed. The evaluation results are shown in Tables 1 to 3.

During the preparation of the bonding material, the thixotropic ratio was 1.5, and the thermal weight reduction ratio was 0.05%. The surface roughness (Ra) after coating was 2.2 μm and the surface roughness (Ra) of preliminary fired film was 2.2 μm. The flex durability was 76.2%.

Example 7

The same operation as in Example 6 was performed except that oxydiacetic acid (DGA) was not used (not added) as a flux and 9.000 g of octanediol (ODO) was used as a dispersion medium in Example 6, whereby a bonding material according to Example 7 was prepared. The same evaluation as in Example 1 was performed. Therefore, 1.000 g of 2-butoxyyethoxyacetic acid (BEA) was contained for decreasing the viscosity and thixotropic ratio. The evaluation results are shown in Tables 1 to 3.

During the preparation of the bonding material, the thixotropic ratio was 1.5, and the thermal weight reduction ratio was 0.10%. The surface roughness (Ra) after coating was 2.5 μm and the surface roughness (Ra) of preliminary fired film was 2.4 μm. The flex durability was 71.8%.

Comparative Example 1

The same operation as in Example 1 was performed except that 11.902 g of octanediol (ODO) was used as a dispersion medium, 2-methoxyethoxyacetic acid (MEA) for decreasing the viscosity and thixotropic ratio was not used, and 0.098 g of oxydiacetic acid (DGA) was used as a flux, whereby a bonding material according to Comparative Example 1 was prepared. The same evaluation as in Example 1 was performed. The evaluation results are shown in Tables 1 to 3.

Figure 4:
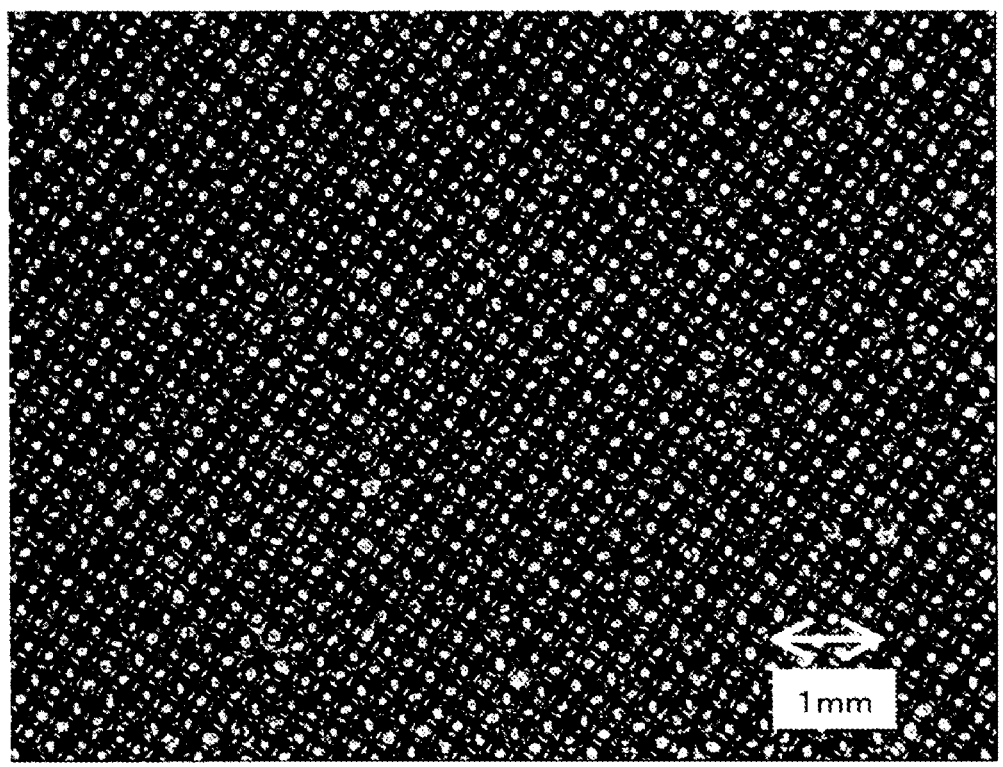
FIG. 4 is a photograph of a coating film in Comparative Example 1.
Figure 5:
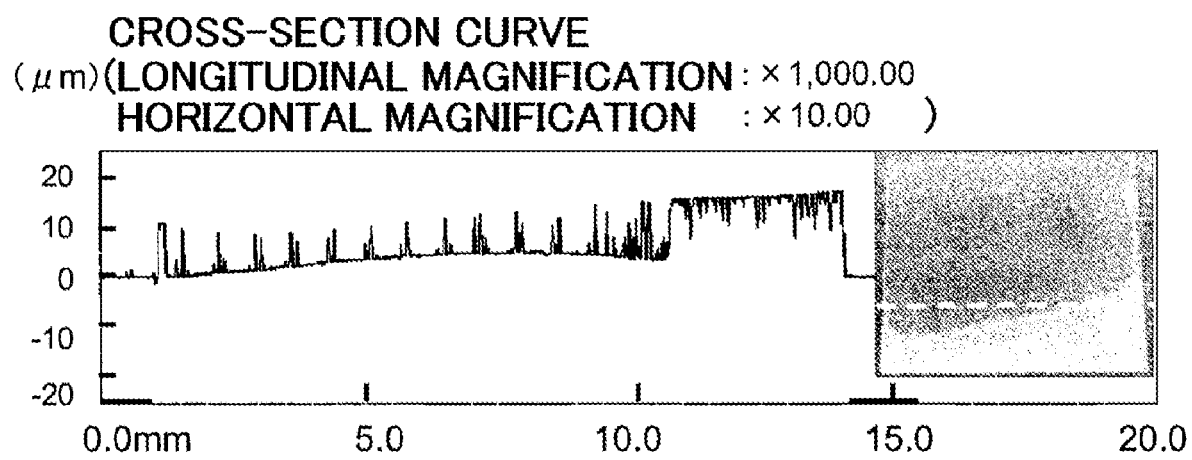
FIG. 5 is a profile view of a pressurized and fired film which is measured with a stylus type surface roughness tester in Comparative Example 1.

During the preparation of the bonding material, the thixotropic ratio was 5.0, and the thermal weight reduction ratio was 0.07%. Since the bonding material had high viscosity and thixotropy and poor printing was generated on the coating film during printing, the same evaluation as in Example 1 was not performed. FIG. 4 shows an image of the obtained coating film. For comparison with Example 1, a copper substrate on which a 15 mm square glass was mounted as a chip was pressurized and fired in the same manner to prepare a fired film. The resulting fired film was measured with a surface roughness tester, to obtain a profile of the fired film in FIG. 5. FIG. 5 simultaneously shows a surface photograph. A white dotted line is a measurement line. The measurement line includes a part on which glass is not partly mounted.

FIG. 4 is a photograph of the bonding material after coating with a metallographical microscope at a magnification of 100. On the surface, a texture of a screen gauze was reflected as it was. This showed that a bonding material to pass through a screen adhered to the surface of an object to be attached, and hardly moved. As shown in the profile of FIG. 5, although a pressure was applied by glass, the roughness of pitch derived from the texture of the screen gauze remained.

Comparative Example 2

The same operation as in Example 1 was performed except that 80.0 g of dried powder of aggregate of silver nanoparticles coated with sorbic acid (average primary particle diameter: 100 nm) as a silver nanoparticle powder, 0.089 g of oxydiacetic acid (DGA) as a flux, and 19.911 g of octanediol as a dispersion medium in Comparative Example 1 were used, whereby a bonding material according to Comparative Example 2 was prepared. The same evaluation as in Example 1 was performed. The evaluation results are shown in Tables 1 to 3.

During the preparation of the bonding material, the thixotropic ratio was 4.8, and the thermal weight reduction ratio was 0.08%. The surface roughness (Ra) after coating was 14.3 μm and the surface roughness (Ra) of preliminary fired film was 6.8 μm. The flex durability was 54.4%.

Comparative Example 3

The same operation as in Example 4 was performed except that 2-methoxyethoxyacetic acid (MEA) was not used (not added) for decreasing the viscosity and thixotropic ratio and 9.950 g of octanediol (ODO) was used as a dispersion medium, whereby a bonding material according to Comparative Example 3 was prepared. The same evaluation as in Example 1 was performed. The evaluation results are shown in Tables 1 to 3.

During the preparation of the bonding material, the thixotropic ratio was 4.2, and the thermal weight reduction ratio was 0.04%. The surface roughness (Ra) after coating was 24.2 μm and the surface roughness (Ra) of preliminary fired film was 9.5 μm. The flex durability was 18.0%.

TABLE 1

| | SILVER COMPONENT | | SOLVENT | ADDITION COMPONENT | | |
|---|---|---|---|---|---|---|
| | 100 nm % BY MASS | 0.6 μm % BY MASS | ODO % BY MASS | DGA % BY MASS | MEA % BY MASS | BEA % BY MASS |
| EXAMPLE 1 | 88.0 | — | 10.9 | 0.098 | 1.000 | — |
| EXAMPLE 2 | 87.0 | — | 11.9 | 0.097 | 1.000 | — |
| EXAMPLE 3 | 85.0 | — | 13.9 | 0.094 | 1.000 | — |
| EXAMPLE 4 | 45.0 | 45.0 | 9.0 | 0.050 | 1.000 | — |
| EXAMPLE 5 | 45.0 | 45.0 | 9.0 | — | 1.000 | — |
| EXAMPLE 6 | 45.0 | 45.0 | 9.0 | 0.025 | — | 1.000 |
| EXAMPLE 7 | 45.0 | 45.0 | 9.0 | — | — | 1.000 |
| COMPARATIVE EXAMPLE 1 | 88.0 | — | 11.9 | 0.098 | — | — |

TABLE 1-continued

| | SILVER COMPONENT | | SOLVENT | ADDITION COMPONENT | | |
|---|---|---|---|---|---|---|
| | 100 nm % BY MASS | 0.6 μm % BY MASS | ODO % BY MASS | DGA % BY MASS | MEA % BY MASS | BEA % BY MASS |
| COMPARATIVE EXAMPLE 2 | 80.0 | — | 19.9 | 0.089 | — | — |
| COMPARATIVE EXAMPLE 3 | 45.0 | 45.0 | 10.0 | 0.050 | — | — |

CODE IN TABLE DESCRIBED ABOVE
ODO OCTANEDIOL
DGA OXYDIACETIC ACID (DIGLYCOLIC ACID)
MEA 2-METHOXYETHOXYACETIC ACID
BEA 2-BUTOXYETHOXYACETIC ACID

TABLE 2

| | VISCOSITY (3.1[1/S]) [Pa·s] | VISCOSITY (15.7[1/S]) [Pa·s] | THIXOTROPIC | THERMAL WEIGHT REDUCTION RATIO(%) | | | AG CONCENTRATION (DESIGN) % BY MASS | AG CONCENTRATION (MEASURED) % BY MASS |
|---|---|---|---|---|---|---|---|---|
| | | | | 250° C. | 350° C. | 350-250° C. | | |
| EXAMPLE 1 | 133.0 | 35.9 | 3.7 | 87.1 | 87.0 | 0.1 | 87.4 | 87.1 |
| EXAMPLE 2 | 53.1 | 18.9 | 2.8 | 86.3 | 86.2 | 0.1 | 86.4 | 86.0 |
| EXAMPLE 3 | 11.6 | 5.4 | 2.1 | 84.2 | 84.1 | 0.1 | 84.4 | 84.6 |
| EXAMPLE 4 | 13.9 | 7.8 | 1.8 | 89.6 | 89.5 | 0.1 | 89.5 | 89.5 |
| EXAMPLE 5 | 4.9 | 3.6 | 1.4 | 89.4 | 89.3 | 0.1 | 89.5 | 89.3 |
| EXAMPLE 6 | 7.2 | 4.7 | 1.5 | 89.5 | 89.4 | 0.0 | 89.5 | 89.4 |
| EXAMPLE 7 | 5.4 | 3.5 | 1.5 | 89.5 | 89.4 | 0.1 | 89.5 | 89.4 |
| COMPARATIVE EXAMPLE 1 | 1030.0 | 206.5 | 5.0 | 87.2 | 87.2 | 0.1 | 87.4 | 87.1 |
| COMPARATIVE EXAMPLE 2 | 75.7 | 15.8 | 4.8 | 79.2 | 79.1 | 0.1 | 79.4 | 79.1 |
| COMPARATIVE EXAMPLE 3 | 517.2 | 123.7 | 4.2 | 89.7 | 89.6 | 0.0 | 89.5 | 89.5 |

TABLE 3

| | EVALUATION OF SURFACE PROPERTY WITH NON-CONTACT ROUGHNESS TESTER | | | | FLEX DURABILITY (BONDING STRENGTH) |
|---|---|---|---|---|---|
| | AFTER COATING | | AFTER PRELIMINARY HEATING | | |
| | FILM THICKNESS (μm) | Ra (μm) | FILM THICKNESS (μm) | Ra (μm) | % (RETENTION RATIO) |
| EXAMPLE 1 | 33.8 | 9.0 | 18.9 | 5.7 | 94.2 |
| EXAMPLE 2 | 30.5 | 5.0 | 18.9 | 3.9 | 95.6 |
| EXAMPLE 3 | 23.9 | 3.0 | 12.9 | 3.0 | 94.3 |
| EXAMPLE 4 | 26.8 | 2.1 | 18.6 | 1.9 | 85.0 |
| EXAMPLE 5 | 26.7 | 2.2 | 17.6 | 2.0 | 77.1 |
| EXAMPLE 6 | 26.3 | 2.2 | 16.6 | 2.2 | 76.2 |
| EXAMPLE 7 | 26.3 | 2.5 | 16.6 | 2.4 | 71.8 |
| COMPARATIVE EXAMPLE 1 | — | — | — | — | — |
| COMPARATIVE EXAMPLE 2 | 34.4 | 14.3 | 14.1 | 6.8 | 54.4 |
| COMPARATIVE EXAMPLE 3 | 33.3 | 26.0 | 24.2 | 9.5 | 18.0 |

In Example 1, the viscosity at a shear rate of 15.7 [1/s] was as relatively high as 35.9 Pa·s, but the application property was excellent. The surface roughness (Ra) after coating was 10 μm or less. On the other hand, in Comparative Example 2 in which the viscosity at the same shear rate was 15.8 Pa·s, the surface roughness (Ra) after coating was as poor as 14.3 μm. As a result, in Example 1, the retention ratio of to flex durability was 94.2% as the bonding strength. On the other hand, in Comparative Example 2, it was only 54.4%.

In consideration of a high thixotropic ratio of 4.8 in Comparative Example 2, this may be because the silver fine particles and the solvent were not sufficiently integrated in the bonding material. In Comparative Example 2, the surface after coating was undulated like earthworm, and appeared to be wet by a liquid. Since a sample in which the content of the solvent was increased (by 19.9% by mass) was used in Comparative Example 2, it is considered that when the sample is diluted with the solvent only to decrease the viscosity, the application property of the bonding material deteriorates.

Therefore, when the actual viscosity was low but the thixotropic ratio was high, the shape retention of the coating material was high and the shape of texture of the screen gauze after passing through the screen remained. As a result, the bonding strength became low (Comparative Example 2). On the other hand, when the apparent viscosity was high but the thixotropic ratio was low, the application property of the bonding material was good. As a result, the bonding strength became high (Example 1).

FIG. 1 represents a graph showing a relationship of a thixotropic ratio and a percentage of retention after flexing (%) (bonding strength) in Examples and Comparative Examples above. The vertical axis represents the percentage of retention after flexing (%) and the horizontal axis represents the thixotropic ratio. There was a large difference in the percentage of retention after flexing (bonding strength) between before and after a thixotropic ratio of 4.0 (see the dotted line).

As described above, when the viscosity is slightly high but a condition of thixotropic ratio of 4.0 or lower is met, it is judged that a favorable bonding strength can be obtained as shown in each Example. That is, when the bonding material of the present invention meets the requirement of thixotropic ratio of 4.0 or lower, it is judged to exhibit the application property suitable in screen printing. Of course, it is further desirable that the absolute value of viscosity fall within a predetermined range.

INDUSTRIAL APPLICABILITY

The bonding material and the bonded object, and a bonding method according to the present invention can be applied to a non-insulated type semiconductor device and a hear chip mounting-assembling technology and can also be applied to a power device (IGBTs, rectifier diodes, power transistors, power MOSFETs, insulated-gate bipolar transistors, thyristors, gate turn-off thyristors, and triacs. They can be applied to a bonding material for glass having a chromium-treated surface and to a bonding material for an electrode and a frame of a lighting device using an LED.

The invention claimed is:

1. A bonding material comprising: silver nanoparticles which have an average primary particle diameter of 1 nm to 200 nm and have been coated with an organic substance having 8 or less carbon atoms; a dispersion medium; and a viscosity modifier composed of an organic substance, wherein the bonding material has a viscosity measured at a shear rate of 15.7 [1/s] of 100 Pa·s or lower and a thixotropic ratio (a viscosity measured at a shear rate of 3.1 [1/s]/a viscosity measured at a shear rate of 15.7 [1/s]) of 4 or lower.

2. The bonding material according to claim 1, further comprising silver particles having an average particle diameter of 0.5 to 10.0 μm.

3. The bonding material according to claim 1, wherein the viscosity modifier is a substance having an ether linkage in its structure.

4. The bonding material according to claim 3, wherein the viscosity modifier further has a carboxyl group.

5. The bonding material according to claim 1, wherein the viscosity modifier contains two or three ether linkages in the structure.

6. The bonding material according to claim 5, wherein the viscosity modifier further has a carboxyl group.

7. The bonding material according to claim 1, wherein the viscosity modifier is any of 2-methoxyethoxyacetic acid and 2-butoxyethoxyacetic acid.

8. The bonding material according to claim 1, wherein a weight reduction ratio between 250° C. and 350° C. during an increase in temperature from 40° C. at 10° C./min is 0.1% or less in TG measurement under a nitrogen atmosphere.

9. A silver coating film by a screen printing method using the bonding material according to claim 1, wherein a surface roughness (Ra) measured with a laser microscope immediately after printing is 10 μm or less.

10. A bonded object formed using the bonding material according to claim 1.

* * * * *